United States Patent
Yoshioka

(10) Patent No.: US 8,193,957 B2
(45) Date of Patent: Jun. 5, 2012

(54) SUCCESSIVE APPROXIMATION REGISTER ANALOG TO DIGITAL CONVERTER (ADC) AND METHOD OF ADJUSTING DELAY THEREOF

(75) Inventor: Masato Yoshioka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 43 days.

(21) Appl. No.: 12/879,377

(22) Filed: Sep. 10, 2010

(65) Prior Publication Data

US 2011/0063147 A1    Mar. 17, 2011

(30) Foreign Application Priority Data

Sep. 11, 2009    (JP) ................................. 2009-210398

(51) Int. Cl.
   *H03M 1/06*    (2006.01)
(52) U.S. Cl. ........................................ 341/118; 341/120
(58) Field of Classification Search .................. 341/118, 341/117, 120, 122, 143, 161, 172
   See application file for complete search history.

(56) References Cited

U.S. PATENT DOCUMENTS

| | | | | |
|---|---|---|---|---|
| 4,654,584 | A * | 3/1987 | Gyles | 324/76.13 |
| 6,400,302 | B1 * | 6/2002 | Amazeen et al. | 341/172 |
| 2009/0009373 | A1 * | 1/2009 | Yoshinaga | 341/143 |

FOREIGN PATENT DOCUMENTS

| JP | 7-264071 A | 10/1995 |
|---|---|---|
| JP | 2001-144616 A | 5/2001 |

* cited by examiner

*Primary Examiner* — Joseph Lauture
(74) *Attorney, Agent, or Firm* — Fujitsu Patent Center

(57) ABSTRACT

A successive approximation register analog-to-digital converter includes: a digital-to-analog converter that generates an analog voltage based on a digital code; a comparator that receives the analog voltage; a control circuit that generates a digital code of an input voltage sampled from an external clock signal by successively changing the digital code based on a comparison result of the comparator; a delay circuit that resets the comparator based on a signal transition generated by delaying the comparison result; and an adjustment circuit that counts a value indicating a number of the signal transition being generated during a cycle of the external clock signal and adjusts a delay of the delay circuit according to a counted value.

11 Claims, 15 Drawing Sheets

SUCCESSIVE APPROXIMATION REGISTER ANALOG TO DIGITAL CONVERTER (ADC) AND METHOD OF ADJUSTING DELAY THEREOF

CROSS-REFERENCE TO RELATED APPLICATIONS

This application claims the benefit of priority from Japanese Patent Application No. 2009-210398 filed on Sep. 11, 2009, the entire contents of which are incorporated herein by reference.

BACKGROUND

1. Field

The embodiments discussed herein are related to a successive approximation register analog to digital converter (ADC) and method of adjusting a delay thereof.

2. Description of Related Art

A successive approximation register (SAR) analog to digital converter (ADC) may include a simple circuit with high consistency with CMOS processes and may convert a signal at high-speed. The successive approximation register analog-to-digital converter includes a digital-to-analog converter (DAC), a comparator, and a DAC control circuit. As an entire operation, an input voltage during a sampling period is sampled and the sampled signal is stored as a sample voltage and the sample voltage and voltages to be compared are successively compared during a subsequent comparison period. Through successive comparison operations, the DAC generates a plurality of voltages to be compared based on a reference voltage Vref, which correspond to a stride of ½ Vref, ¼ Vref, ⅛ Vref . . . , and so on, according to digital codes from the DAC circuit. In one comparison operation, the comparator compares one voltage to be compared that corresponds to one digital code with the sample voltage and determines a magnitude relation between the voltage to be compared and the sample voltage. According to an output of a comparison result of the comparator, the DAC control circuit changes a digital code, thereby changing the voltage to be compared from a large stride to a small stride to successively perform comparison for N-times. An N bits digital code that corresponds to the sample voltage may be obtained through N-times successive comparisons. A magnitude relation between the sample voltage and a voltage to be compared is sufficient information for the comparator. For example, the DAC may generate a difference between the voltage to be compared and the sample voltage, and the comparator may compare the DAC output and a ground voltage.

A DAC of the successive approximation register analog-to-digital converter includes a capacitive DAC, or, a capacitive main DAC and a resistor sub DAC are used. During a sampling period, the capacitive DAC applies input voltages in parallel to a plurality of capacitance elements and each capacitance element is charged to a voltage value substantially equal to the input voltage. After the sampling, one end of the plurality of capacitance elements is selectively coupled, for example, to Vref or GND, and the other end is coupled to a common terminal by switching couplings of the plurality of the capacitance elements by a switch circuit. Electronic charges may be redistributed and a potential corresponding to the voltage obtained by dividing the capacitance between the Vref and GND and the input voltage appears at the common terminal. The potential which appears at the common terminal may be input to the comparator. A desired voltage to be compared is generated by controlling a coupling of the switch circuit using a digital code from the DAC control circuit.

In a synchronous successive approximation register analog-to-digital converter, a DAC, a comparator, and a DAC control circuit operate in synchronization with an external clock signal. The external clock signal may be faster than a clock signal for sampling.

In an asynchronous successive approximation Register analog-to-digital converter, an operation clock signal that corresponds to one pulse is generated from one comparison result output from the comparator based on a change in a comparator output signal. The DAC, the comparator, and the DAC control circuit are operated in synchronization with the clock signal. Since the output of the comparator may be input to the asynchronous successive approximation register analog-to-digital converter and an output of the asynchronous successive approximation register analog-to-digital converter may become a reset input to the comparator, a loop is formed, thereby a clock signal being generated through self-excitation. For example, a pulse signal that is generated based on the output of the comparator is delayed by a delay circuit and the delayed pulse signal may be input to a reset terminal of the comparator.

When the delay circuit includes a delay element array using a gate circuit such as an inverter, the delay quantity (e.g., the time delay) of the delay circuit may be varied depending on changes in fabrication processes, temperatures, and power supply voltages. When the change increases the delay quantity, one cycle of a self-excitation clock increases and a certain times of comparison operations (N times for N bit resolution) within a certain sampling cycle may not be executed. When a delay quantity decreases due to the change, one cycle of a self-excitation clock decreases and operations of the DAC, the comparator, and the DAC control circuit may not follow the clock speed.

In order to adjust variation in delays of the delay circuit, the successive approximation register analog-to-digital converter may use a phase locked loop (PLL) and a delay locked loop (DLL).

SUMMARY

According to one aspect of the embodiments, a successive approximation register analog-to-digital converter, includes: a digital-to-analog converter that generates an analog voltage based on a digital code; a comparator that receives the analog voltage; a control circuit that generates a digital code of an input voltage sampled from an external clock signal by successively changing the digital code based on a comparison result of the comparator; a delay circuit that resets the comparator based on a signal transition generated by delaying the comparison result; and an adjustment circuit that counts a value indicating a number of the signal transition being generated during a cycle of the external clock signal and adjusts a delay of the delay circuit according to a counted value.

The object and advantages of the invention may be realized and achieved by at least the elements and features particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
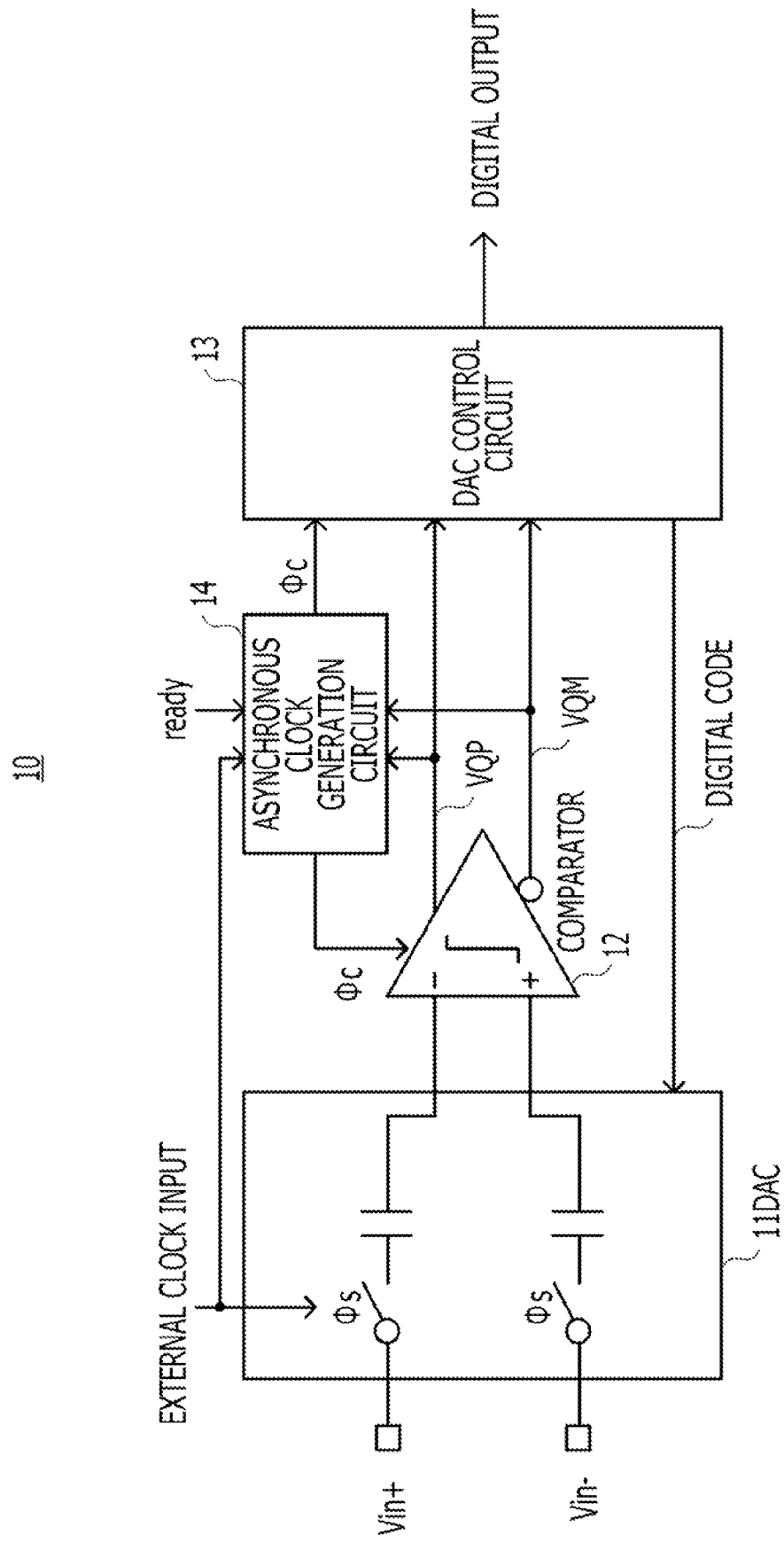
FIG. 1 illustrates an exemplary successive approximation register.

FIG. 1 illustrates an exemplary successive approximation register analog-to-digital converter. The successive approximation register analog-to-digital converter illustrated in FIG. 1 includes a DAC 11, a comparator 12, a DAC control circuit 13, and an asynchronous clock generation circuit 14. The DAC 11 generates an analog voltage based on a digital code from the DAC control circuit 13. The comparator 12 performs a comparison operation by receiving the analog voltage from the DAC 11. The DAC control circuit 13 generates a digital code for an input voltage sampled in a cycle of an external clock signal by successively changing digital codes based on comparison results of the comparator 12. In the successive approximation register analog-to-digital converter illustrated in FIG. 1, the DAC 11 may include a capacitive DAC. In FIG. 1, the DAC 11 and the comparator 12 may input and output single-phase signals or differential signals. The DAC 11 may include a resistor DAC (not shown), or a DAC circuit that includes a capacitive main DAC and a resistor sub DAC. The DAC 11 and the comparator 12 may input and output single-phase signals.

The capacitive DAC 11 stores analog input voltages Vin+ and Vin− in an internal capacitance element while an external clock signal φs is at a high level, for example, in a sampling period. For example, input voltages Vin+ are applied in parallel to each of a plurality of capacitance elements at a positive side, and each capacitance element is charged to a voltage substantially equal to an input voltage Vin+. After the sampling, one end of the plurality of capacitance elements may be selectively coupled, for example, to a reference voltage Vref− or GND (signal ground), and the other end may be coupled to a common terminal, for example, at the positive side by a switch circuit switching couplings of the plurality of the capacitance elements at the positive side. Accordingly, electronic charges are redistributed and a potential that corresponds to the voltage obtained by dividing the capacitance between the Vref+ and GND and the input voltage Vin+ appears at the common terminal at a positive side. Similarly, input voltages Vin− are applied in parallel to each of a plurality of capacitance elements at a negative side and each of the capacitance elements is charged to a voltage value substantially equal to an input voltage Vin−. After the sampling, one end of the plurality of capacitance elements is selectively coupled, for example, to a reference voltage Vref− or GND (signal ground), and the other end to a common terminal at a negative side by the switch circuit switching couplings of the plurality of the capacitance elements at the negative side. Accordingly, electronic charges are redistributed and a potential that corresponds to the voltage obtained by dividing the capacitance between the Vref− and GND and the input voltage Vin− appears at the common terminal at the negative side. The potentials, which appear at the common terminals at the positive side and the negative side, are input to two input terminals of the comparator 12. A desired voltage to be compared is generated by controlling a coupling of the switch circuit by a digital code from the DAC control circuit 13. The two input terminals of the comparator 12 may be short-circuited to each other during the sampling period.

A reset terminal of the comparator 12 receives a pulse signal φc generated by the asynchronous generation circuit 14. The pulse signal φc is supplied to the DAC control circuit 13 as well. The pulse signal φc may be a clock signal that synchronizes successive comparison operation of the successive approximation register 10. The pulse signal φc may not be synchronized with the external clock signal φs. The circuit 14 that generates the pulse signal φc may be referred as the asynchronous clock generation circuit. The comparator 12 performs a comparison operation during a high-level period of the pulse signal φc and resets or stops comparison operation during a low-level period of the pulse signal φc. Two outputs of the comparator 12, VQP and VQM may have different potentials according to the comparison result during a high-level period of the pulse signal φc and may have substantially the same potentials during a low-level period of the pulse signal φc.

The DAC control circuit 13 successively changes digital codes in synchronization with the pulse signal φc, for example, a signal transition of the pulse signal φc. Accordingly, comparison operation by the comparator 12 is successively performed by successively changing a coupling condition of an internal switch of the DAC 11. The difference between two output voltages of the DAC 11 may be gradually reduced by changing digital codes while performing successive comparison with a stride of reference voltages ½, ¼, ⅛ . . . . In this manner, the DAC control circuit 13 retrieves a digital code, for example, switch condition corresponding to a difference between an analog input potential Vin+ and Vin−.

Figure 2:
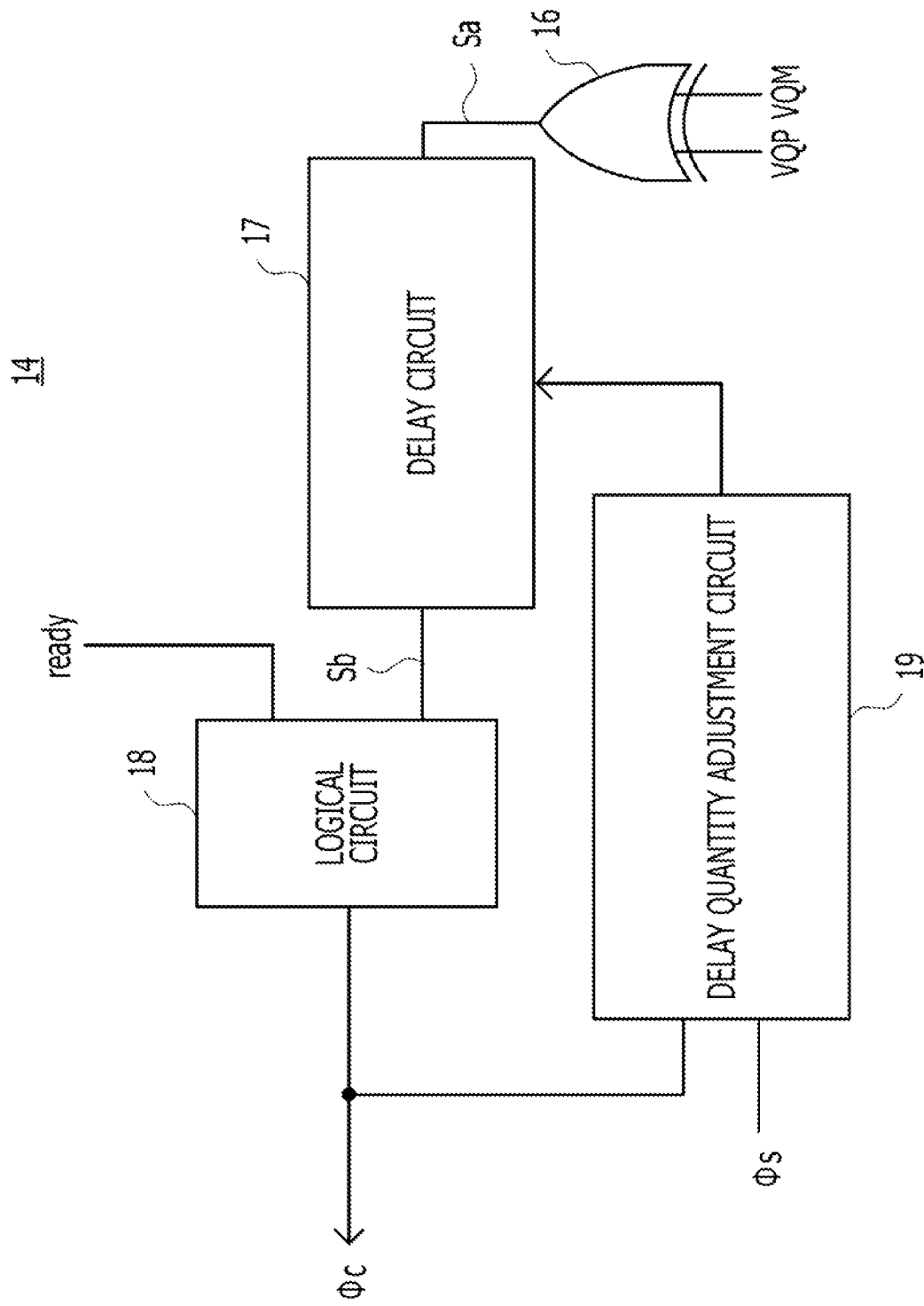
FIG. 2 illustrates an exemplary asynchronous clock generation circuit.

FIG. 2 illustrates an exemplary asynchronous clock generation circuit. The asynchronous clock generation circuit 14 illustrated in FIG. 2 includes an exclusive OR (XOR) circuit 16, a delay circuit 17, a logic circuit 18, and a delay quantity adjustment circuit 19. The XOR circuit 16 receives comparison result outputs, VQP and VQM of the comparator 12 and outputs a first signal value, for example, a high-level signal according to an assert of the comparison result output and outputs a second signal value, for example, a low-level signal according to a negate of the comparison result output. The XOR circuit 16 outputs the high-level signal when VQP and VQM have different potentials according to the comparison result, and outputs the low-level signal when VQP and VQM have substantially the same potentials. The delay circuit 17 resets the comparator 12 according to the signal transition generated by delaying a signal condition change of an output of the comparator 12. The delay circuit 17 generates a pulse signal Sb by delaying and inverting a signal Sa, for example, an output of the XOR circuit according to an output of the comparator 12. The logic circuit 18 makes a pulse signal φc a high level when a ready signal changes from high to low. When the ready signal stays at a low level, the logic circuit 18 let a pulse signal Sb, which is output from the delay circuit 17, pass through as it is and outputs the pulse signal Sb as the pulse signal φc. The comparator 12 may be reset by a falling edge of the pulse signal φc. When the pulse signal φc becomes a low level, the output of the comparator 12 becomes a negate state, for example, VQP and VQM may become substantially the same potentials. A signal transition of the pulse signal φc is generated by delaying the signal state change of the output of the comparator 12, for example, an edge of an output of the XOR circuit 16, by the delay circuit 17, and the comparator 12 may be reset by the signal transition of the falling edge of the pulse signal φc.

The delay quantity adjustment circuit 19 counts a number of the signal transitions of falling of the pulse signal φc (falling edge) generated during one cycle of an external clock signal φs and adjusts a delay quantity of the delay circuit 17 according to the counted number of the signal transitions. For example, the delay quantity adjustment circuit 19 may increase a delay quantity of the delay circuit 17 when an edge count value may be a certain number or more and may decrease a delay quantity of the delay circuit 17 when an edge count value may be a certain number or less.

Figure 3:
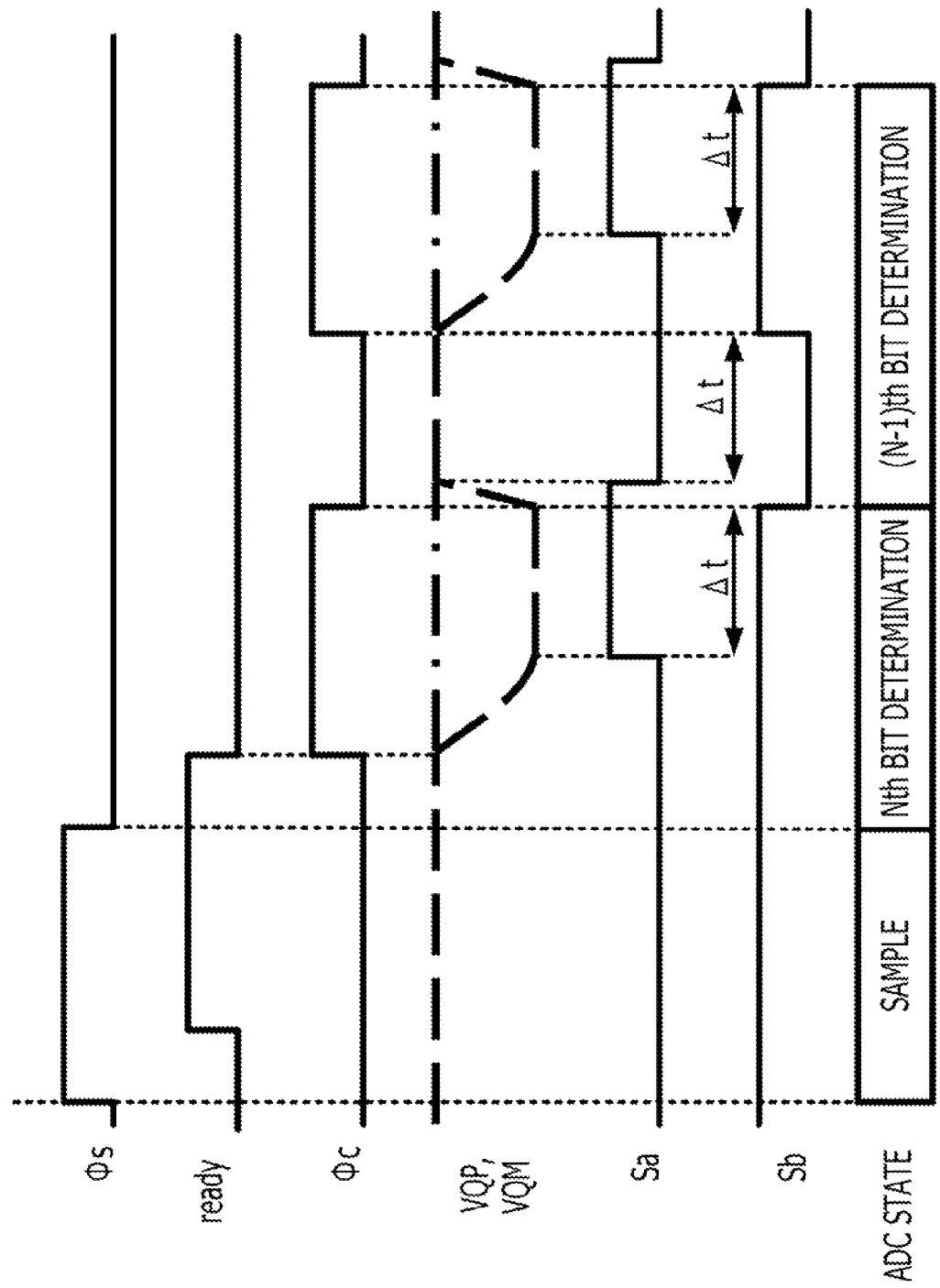
FIG. 3 illustrates an exemplary operation of a successive approximation register analog-to-digital converter.
Figure 4:
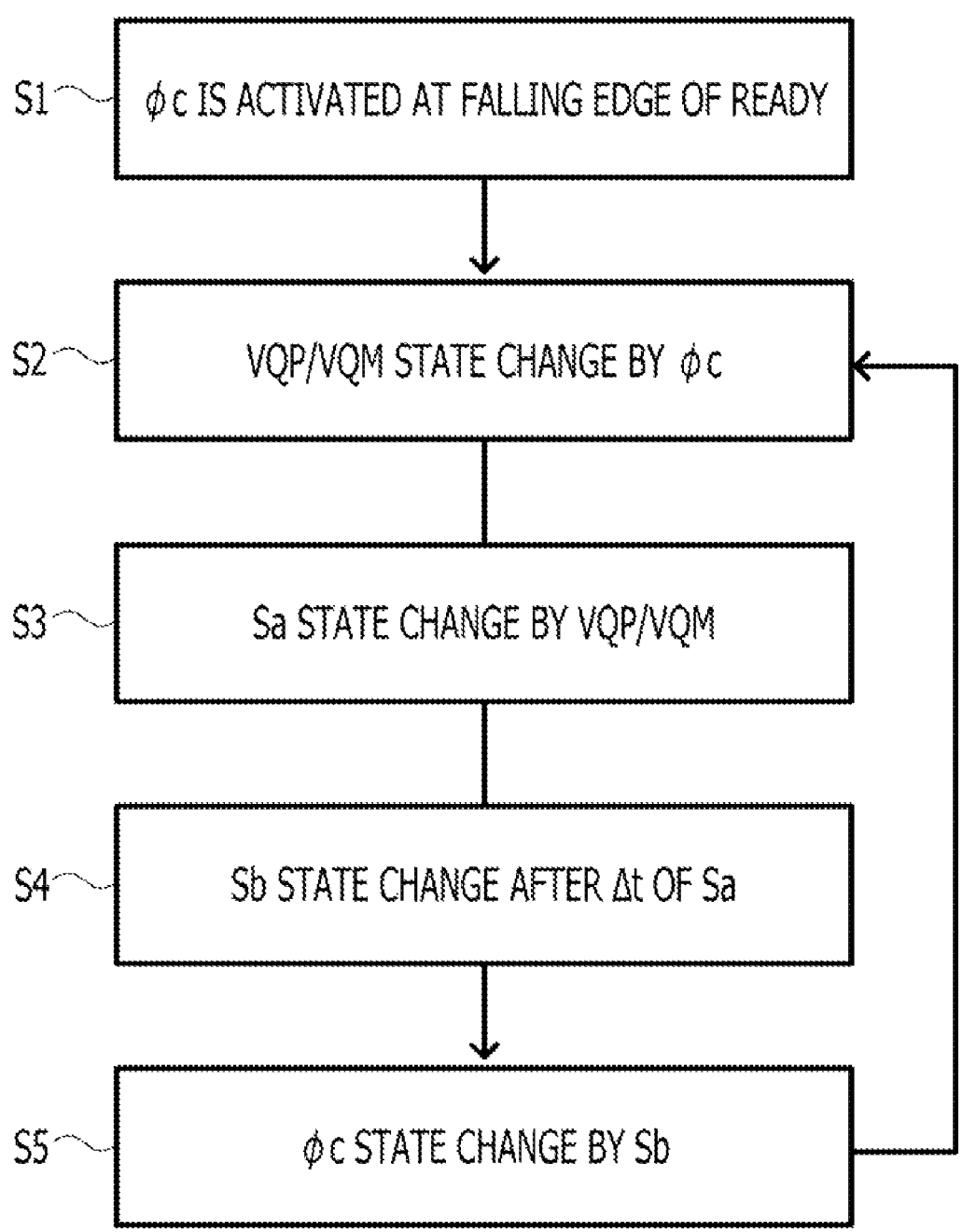
FIG. 4 illustrates an operation of a successive approximation register.

FIG. 3 illustrates an exemplary operation of a successive approximation register ADC. The successive approximation register ADC may be the successive approximation register ADC 10 of FIG. 1. FIG. 4 illustrates an exemplary operation of a successive approximation register ADC. As illustrated in FIG. 3, a sampling period may be when an external clock signal φs is at a high level, and the successive approximation register ADC 10 may be in a sampling state. A successive comparison period comes when the external clock signal φs becomes a low level. In the successive comparison period, a ready signal becomes a low level and the pulse signal φc rises to a high level (Operation 51 in FIG. 4). For example, during a low-level period of the ready signal, the pulse signal Sb, which is output by the delay circuit 17 illustrated in FIG. 3, may be a pulse signal φc. The pulse signal Sb, which is output by the delay circuit 17, is at a high level in an initial state as illustrated in FIG. 3 and accordingly the pulse signal φc becomes a high level as well. The comparator 12 may perform a comparison operation at the beginning of successive comparison period by initially setting the pulse signal φc to a high level.

The comparator 12 performs a comparison operation during a high-level period of the pulse signal φc, thereby output voltages VQP and VQM of the comparator 12 becoming different potentials each other according to the comparison result of the comparator 12 as illustrated in FIG. 3 (Operation S2 in FIG. 4). In response to the different potentials, an output signal Sa of the XOR circuit 16 changes from a low level to a high level (Operation S3 in FIG. 4). An output pulse signal Sb of the delay circuit 17 is generated by delaying the output signal Sa of the XOR circuit 16 for the amount of Δt. A state of the pulse signal Sb changes to a low level after Δt from the state of the signal Sa changes to a high level (Operation S4 in FIG. 4). In the example of FIG. 3, the pulse signal Sb is obtained by delaying and inverting the output signal Sa of the XOR circuit 16. In the example of FIG. 3, the pulse signal Sb, which is output by the delay circuit 17, may be a pulse signal φc during a low-level period of the ready signal. Thus, a state change of the pulse signal Sb to a low level appears as a state change of the pulse signal φc to a low level (Operation S5 in FIG. 4). Potentials of the output voltages VQP and VQM of the comparator 12 become substantially the same (Operation S2 in FIG. 4) by stopping comparison operation of the comparator 12 during a low-level period of the pulse signal φc. In response to substantially the same potentials, the output signal Sa of the XOR circuit 16 changes from a high level to a low level (Operation S3 in FIG. 4). The state of the pulse signal Sb changes to a high level after Δt from the state of the signal Sa changes to a low level (Operation S4 in FIG. 4). The state change of the pulse signal Sb to a high level appears as the state change of the pulse signal φc to a high level (Operation S5 in FIG. 4). Successive comparison operations are sequentially performed by repeating operations S2 to S5 in FIG. 4.

Figure 5:
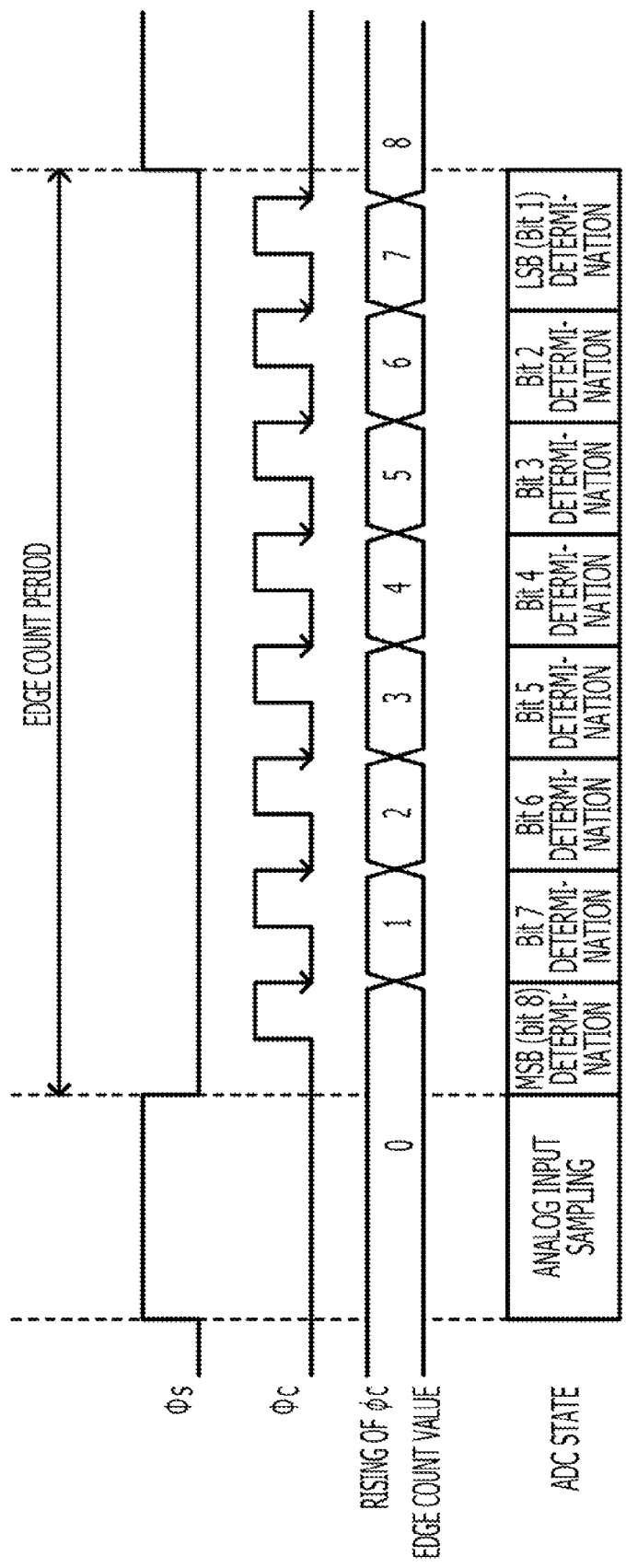
FIG. 5 illustrates an exemplary condition of a successive approximation register.

FIG. 5 illustrates an exemplary condition of a successive approximation register ADC. The condition illustrated in FIG. 5 may correspond to a case in which the successive approximation register ADC 10 provides 8-bit resolution. The delay quantity adjustment circuit 19 counts falling edges of a pulse signal φc generated during one cycle of the external clock signal φs and adjusts a delay quantity of the delay circuit 17 according to the edge count value. For example, a delay quantity of the delay circuit 17 is adjusted so that the edge count value becomes a certain value. When the successive approximation register ADC provides 8-bit resolution, it is desirable to perform successive comparison operations for eight times during one cycle of the external clock signal φs, for example, during a successive comparison period obtained by removing a sampling period from one cycle. For example, a series of operations including eight-time successive comparisons by the comparator 12 and a following reset operation. Falling edges of the pulse signal φc, which make the comparator 12 reset, occurs eight times during an edge count period, for example, during a successive comparison period. All of eight bit values from a most significant bit (MSB) (bit 8) to a least significant bit (LSB) (bit 1) may be determined through successive comparison operation by controlling the edge count number to be 8.

Figure 6:
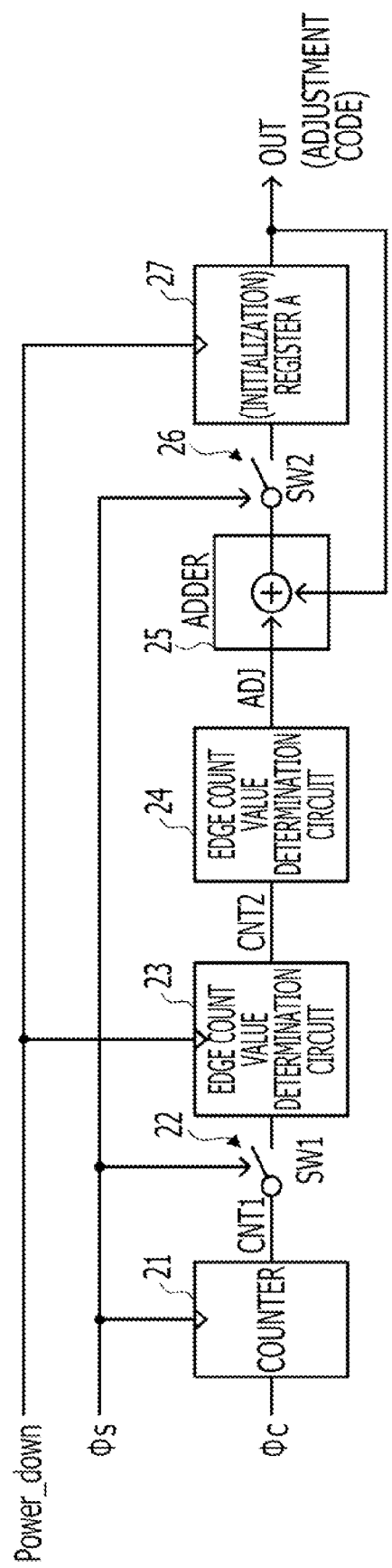
FIG. 6 illustrates an exemplary delay quantity adjustment circuit.

FIG. 6 illustrates an exemplary delay quantity adjustment circuit. The delay quantity adjustment circuit 19 illustrated in FIG. 6 includes a counter 21, a switch 22, a register 23, an edge count value determination circuit 24, an adder 25, a switch 26 and a register 27. The counter 21 counts in response to a falling edge of a pulse signal φc. The counter 21 may be reset while the clock signal φs is at a high level. The counter 21 counts while the clock signal φs is a low level. The switch 22 is conductive when the clock signal φs is at a low level and edge count values, for example, count values of the counter 21 are sequentially stored in the register 23. The switch 22 becomes non-conductive when the clock signal φs is at a high level, and an edge count value of the previous cycle is maintained in the register 23 during the sampling period. The register 23 and the register 27 are set to initial values respectively by a power down signal when starting operation. The edge count value determination circuit 24 determines whether a count value stored in the register 23 is substantially equal to a certain number or not. The edge count value determination circuit 24 sets an output ADJ to 0 when the counter value is substantially equal to the certain value. The edge count value determination circuit 24 sets an output ADJ to +1 when the counter value is larger than the certain value. The edge count value determination circuit 24 sets an output ADJ to −1 when the counter value is less than the certain value. The adder 25 adds a current adjustment code OUT stored in the register 27 to the output ADJ of the edge count value determination circuit 24, and stores the addition result in the register 27 through the switch 26. The register 27 conducts when the clock signal φs becomes a high level and performs an update operation during a sampling period. A delay quantity of the delay circuit 17 is adjusted by changing an adjustment code to be supplied to the delay circuit 17 according to a determination result of the edge count value determination circuit 24.

Figure 7:
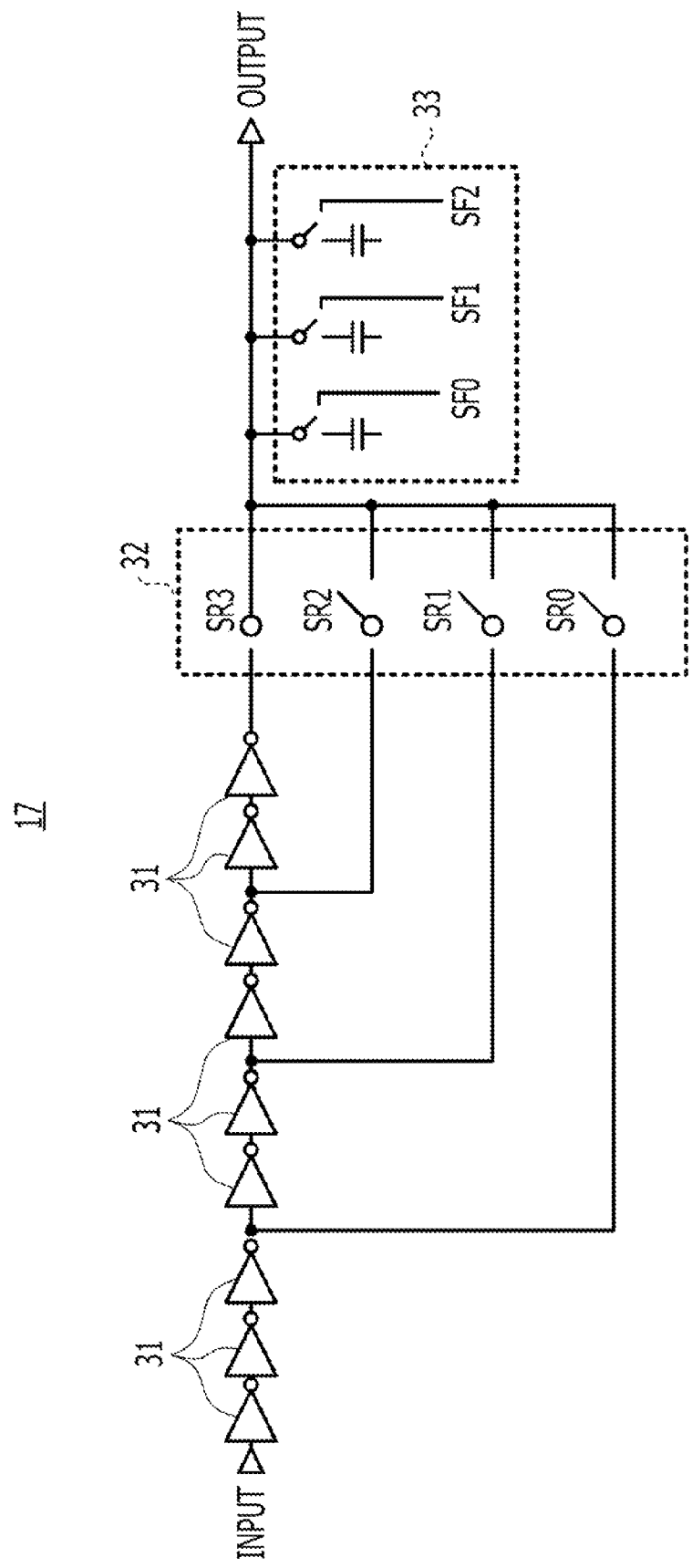
FIG. 7 illustrates an exemplary delay circuit.

FIG. 7 illustrates an exemplary delay circuit 17. The delay circuit 17 of FIG. 7 includes a plurality of delay elements 31, for example, inverts that are serially coupled, a selection circuit 32, and a capacitance adding circuit 33. The selection circuit 32 includes a plurality of switches and conducts one switch by asserting one of the selection signals SR0 to SR3. The selection signals SR0 to SR3 are, for example, signals obtained by decoding output adjustment codes OUT of the register 27 in the delay quantity adjustment circuit 19 in FIG. 6. The selection circuit 32 selectively outputs an output of a delay element among a plurality of delay elements 31 that is selected according to the output of the delay quantity adjustment circuit 19. Accordingly, a delay quantity may be roughly adjusted. The capacitance adding circuit 33 includes a plurality of capacitance elements and switches, and couples one or a plurality of capacitance elements to a signal line through switches by asserting a combination of the signals SF0 to SF1. The selection signals SR0 to SR3 may be, for example, lower bits of the output adjustment code OUT of the register 27 in the delay quantity adjustment circuit 19 of FIG. 6. A delay quantity may be finely adjusted by coupling a capacitance value according to the output of the delay quantity adjustment circuit 19 to a signal line as a load.

Figure 8:
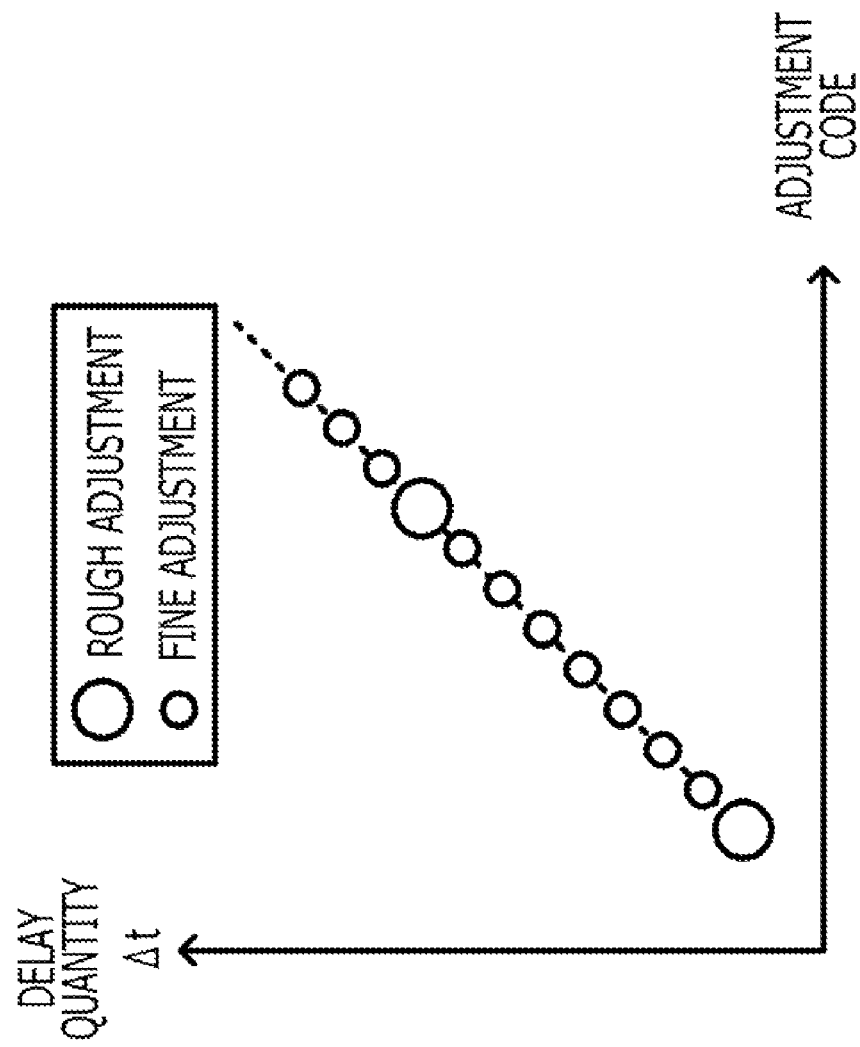
FIG. 8 illustrates an exemplary rough adjustment and an exemplary fine adjustment.

FIG. 8 illustrates an exemplary rough adjustment and an exemplary fine adjustment. In FIG. 8, a delay quantity may be adjusted by the delay circuit 17 of FIG. 7. The horizontal axis in FIG. 8 indicates adjustment codes while the vertical axis indicates delay quantities Δt. For example, adjustment codes may be the adjustment code OUT in FIG. 6. As indicated by linearly arranged plot dots, the delay quantity Δt increases as the adjustment code increases. Delay quantities indicated by plot dots of large circles in FIG. 8 may be obtained by a rough adjustment of a delay quantity by the selection circuit 32 in FIG. 7. Delay quantities indicated by plot dots of small circles in FIG. 8 may be obtained by a fine adjustment of a delay quantity by the capacitance adding circuit 33 in FIG. 7.

Figure 9:
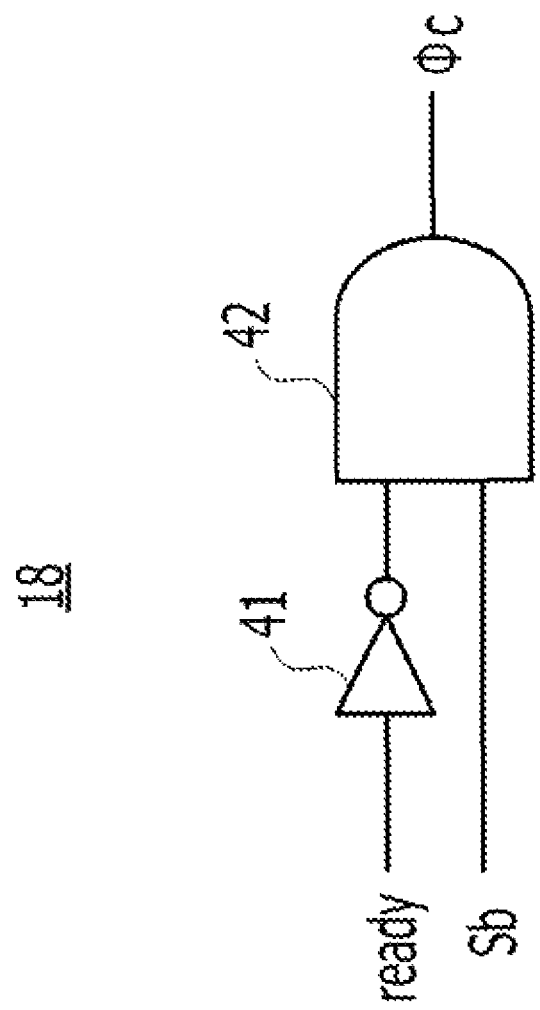
FIG. 9 illustrates an exemplary logic circuit.

FIG. 9 illustrates an exemplary logic circuit 18. The logic circuit 18 illustrated in FIG. 9 includes an inverter 41 and an AND circuit 42. The inverter 41 may invert a ready signal. The AND circuit 42 performs AND operation between an output of the inverter 41 and an output signal Sb of the delay circuit 17. An output of the AND circuit 42 becomes a pulse signal φc. Accordingly, as illustrated in FIG. 3, a pulse signal φc may be generated based on the ready signal and the signal Sb.

Figure 10:
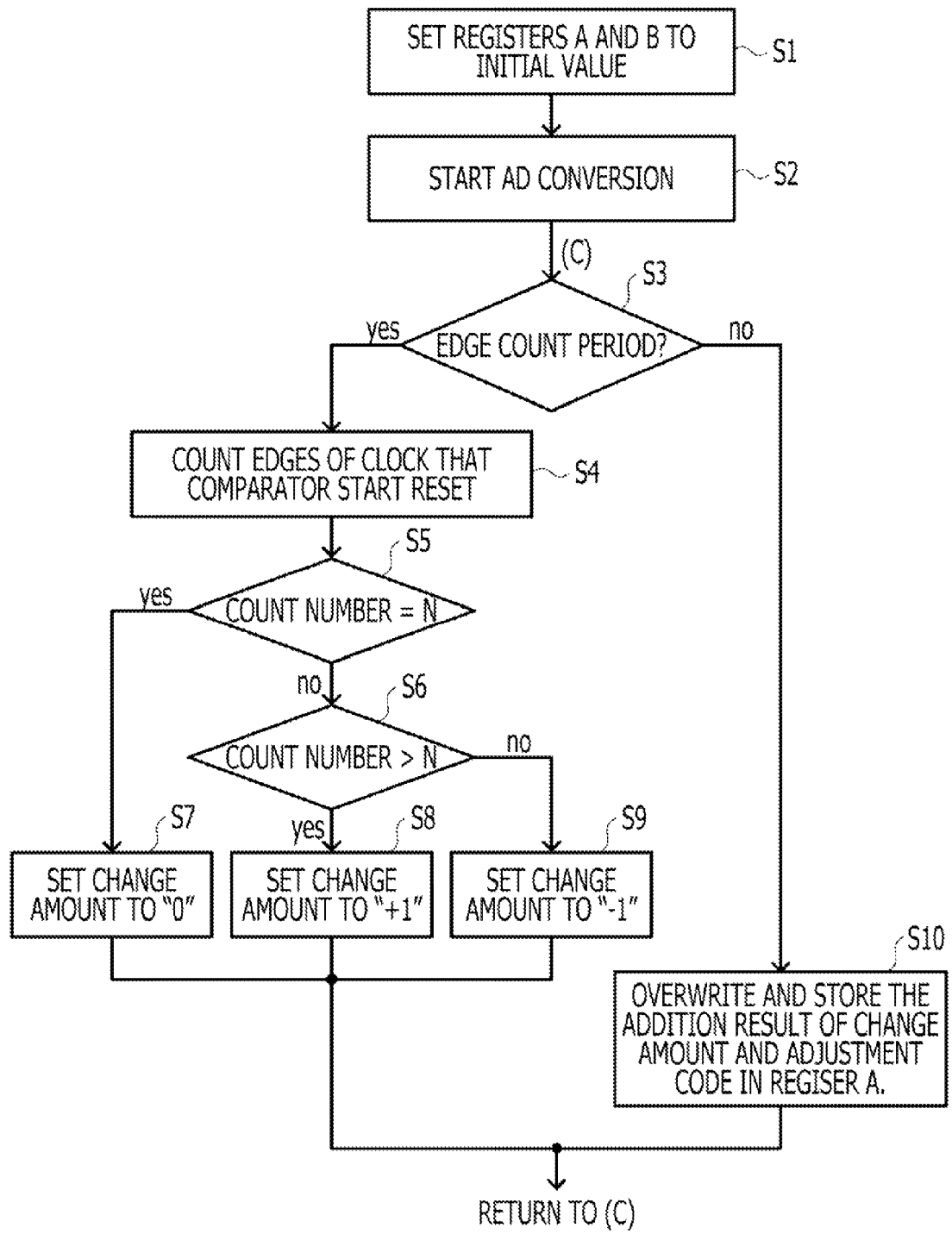
FIG. 10 illustrates an exemplary delay quantity adjustment operation.
Figure 11:
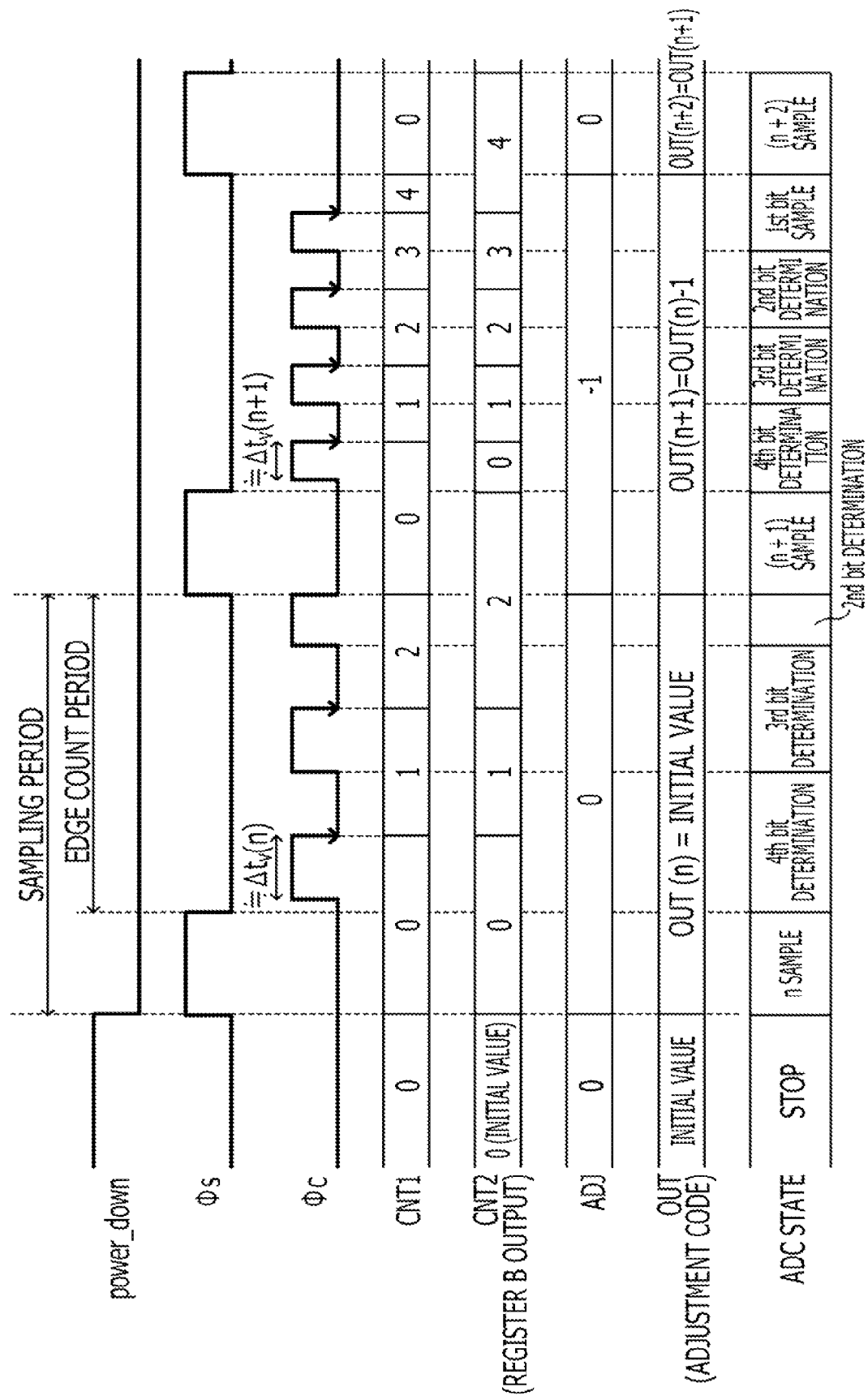
FIG. 11 illustrates exemplary is a timing chart illustrating how each signal changes in a delay quantity adjustment operation.

FIG. 10 is an exemplary delay quantity adjustment operation. The delay quantity adjustment operation may be performed by the delay quantity adjustment circuit 19 illustrated in FIG. 6. FIG. 11 illustrates an exemplary signal change. The signal change illustrated in FIG. 10 may occur in the delay quantity adjustment operation.

In the operation 51 of FIG. 10, the register 23, for example, register A and the register 27, for example, register B illustrated in FIG. 6 may be set to initial values based on a power_down signal. As illustrated in FIG. 11, the register B may be set to 0 and the register A may be set to an initial value based on a high-level power_down signal. For example, the initial value may be a value corresponding to a substantially maximum delay quantity. In the operation S2 of FIG. 10, an AD conversion operation starts. As illustrated in FIG. 11, upon setting a power_down signal to LOW, the AD conversion operation that includes a sampling operation and a successive comparison operation may starts.

In the operation S3, whether the period is an edge count period or not is determined. A clock signal φs that is a reset input of the counter 21 illustrated in FIG. 6 is at a high level or not may be determined. When the clock signal φs is at the high level, the period may be a sampling period and the counter 21 may be reset. During the sampling period, input potential is sampled in the DAC 11 illustrated in FIG. 1. As illustrated in FIG. 11, when the clock signal φs becomes a low level, a successive comparison period, for example, an edge count period starts.

During the edge count period, in the operation S4, the comparator 12 counts edges, for example, falling edge of a clock, for example, pulse signal φc that starts a reset. The counter 21 of FIG. 6 performs, for example, a count up operation in response to a falling edge of the pulse signal φc. As illustrated in the CNT1 of FIG. 11, the count value of the counter 21 increases one by one. The counter value may be reflected to the stored value, for example, output value of the register B, which may corresponds to the register 23 in FIG. 6, as illustrated as the CNT2.

In the operation S5 of FIG. 10, the count value is substantially equal to N, which may correspond to the number of bits of resolution of the successive approximation register ADC 10, or not is determined. For example, the edge count value determination circuit 24 in FIG. 6 determines whether or not the counter value CNT2 of the counter stored in the register 23 is substantially equal to the number of resolution bits N. Moreover, in the operation S6, the edge count value determination circuit 24 in FIG. 6 determines whether or not the count value is larger than N. When the count value is substantially equal to N, a change amount may be set to 0 at the operation S7. The edge count value determination circuit 24 in FIG. 6 may set ADJ to 0. When the count value is larger than N, the change amount may be set to +1 in the operation S8. For example, the edge count value determination circuit 24 in FIG. 6 may set ADJ to +1. When the count value is smaller than N, the change amount may be set to −1 in the operation S9. For example, the edge count value determination circuit 24 in FIG. 6 may set ADJ to −1. ADJ may be updated in synchronization with a rising of the clock signal φs. The edge count value, for example, the count value CNT2 may be 2 when the first edge count period is completed, thus, the ADJ may be set to −1. The edge count value determination circuit 24 may update and output ADJ instead of updating ADJ in synchronization with the rising of the clock signal φs.

The above described process is performed for each falling edge of the pulse signal φc in the edge count period. After completing the edge count period, the determination result of the operation S3 indicates "no" and the process proceeds to the operation S10. In the operation S10, the result of adding the change amount to the adjustment code is overwritten and stored in the register A. For example, in FIG. 6, the value obtained by adding the ADJ value and the current adjustment code OUT is stored in the register 27 as an updated adjustment code OUT by conduction of the switch 26 during the sampling period, for example, a high-level period of the clock signal φc). The ADJ may be −1 in FIG. 11, therefore the updated OUT (n+1 cycle OUT) may be obtained by subtracting 1 (OUT−1) from the current OUT (n cycle OUT).

In the n+1 cycle illustrated in FIG. 11, the edge count value CNT2 when the edge count period is completed may be 4. The resolution bit numbers N may be 4, the count value may be substantially equal to N, and thereby the change amount ADJ may be 0. For example, an appropriate delay quantity may be set to the delay circuit 17. Hence, in n+2 cycles, the value may be maintained as it is without changing an adjustment code OUT that indicates a delay quantity.

Figure 12:
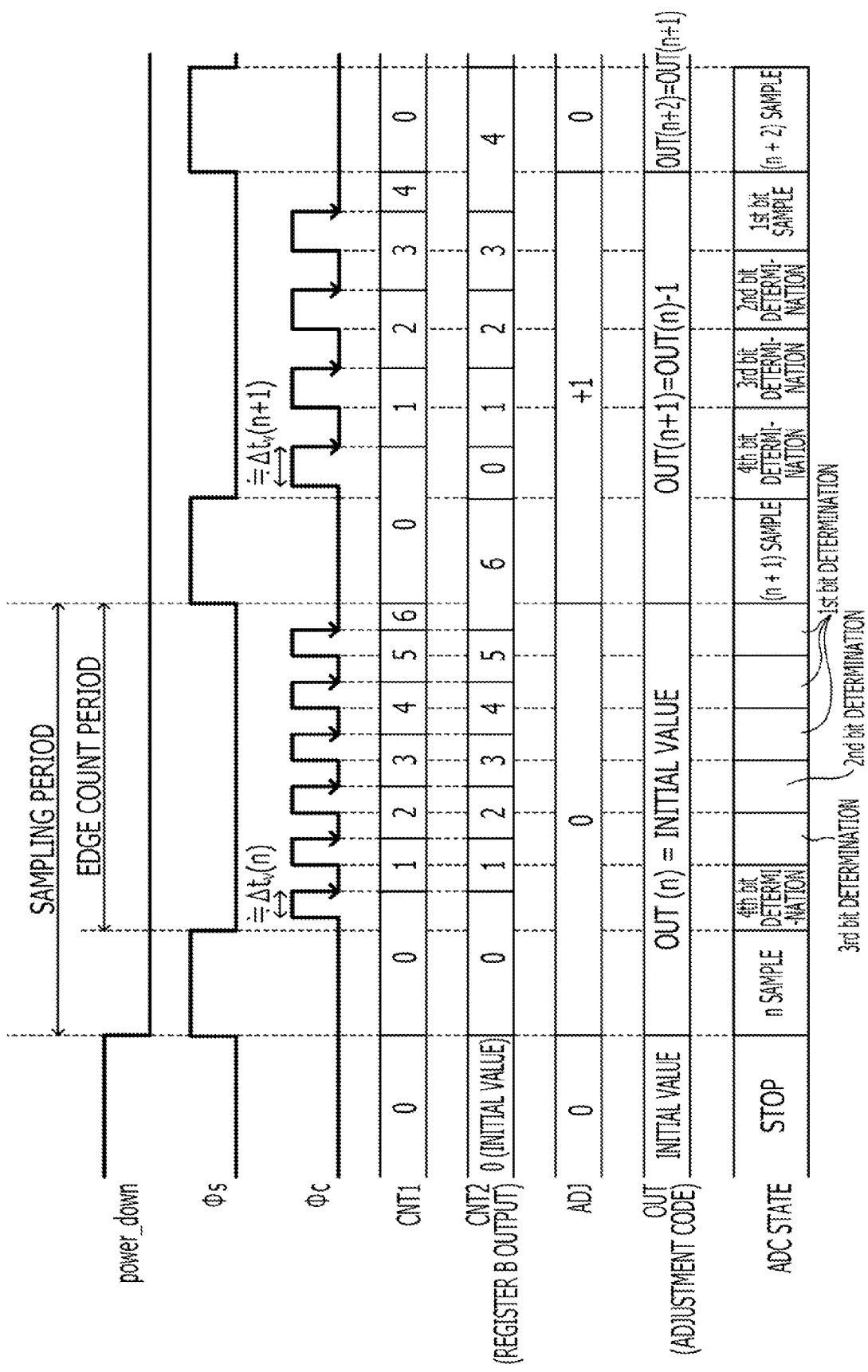
FIG. 12 illustrates exemplary signal changes in a delay quantity adjustment operation.

FIG. 12 illustrates an exemplary signal change. The signal change illustrated in FIG. 12 may occur in the delay quantity adjustment operation. An initial value of the adjustment code OUT may be smaller than an appropriate value, and thereby a delay quantity of the delay circuit 17 set initially may be shorter than the appropriate delay quantity. Since the delay quantity of the delay circuit 17 set initially is shorter than the appropriate delay quantity, an interval between each pulse of a pulse signal φc, for example, a cycle of an operation clock may be too short and the edge count result CNT 2=6 is larger than the number of resolution bits N (=4) during the edge count period. A correct AD conversion result may be obtained as long as the DAC 11, the comparator 12, and the DAC control circuit 13 operate by following a high-speed operation clock. The DAC 11, the comparator 12, and the DAC control circuit 13 may not follow the operation clock because the operation clock is faster than a certain design value. Even if the DAC 11, the comparator 12, and the DAC control circuit 13 may appear to follow the operation clock, a wrong result may be obtained due to deterioration of accuracy. Hence, it is desirable to adjust the edge count value to an appropriate value, 4. An update may be performed so that the adjustment code OUT increases for 1 when ADJ becomes +1. Accordingly, in n+1 cycle, the edge count value CNT 2 may become 4 when the edge count period is completed. For example, the delay quantity of the delay circuit 17 may be set to an appropriate delay quantity, thus, in n+2 cycle, the adjustment code OUT that indicates a delay quantity may be maintained as it is without changing the value.

The above described delay quantity adjustment operation may be performed in parallel with the AD conversion operation of the successive approximation register ADC 10. Even if a delay quantity of the delay circuit 17 is changed due to, for example, changes in temperatures and power supply voltages, the delay quantity may be dynamically adjusted to generate a pulse signal φc with an appropriate timing.

Figure 13:
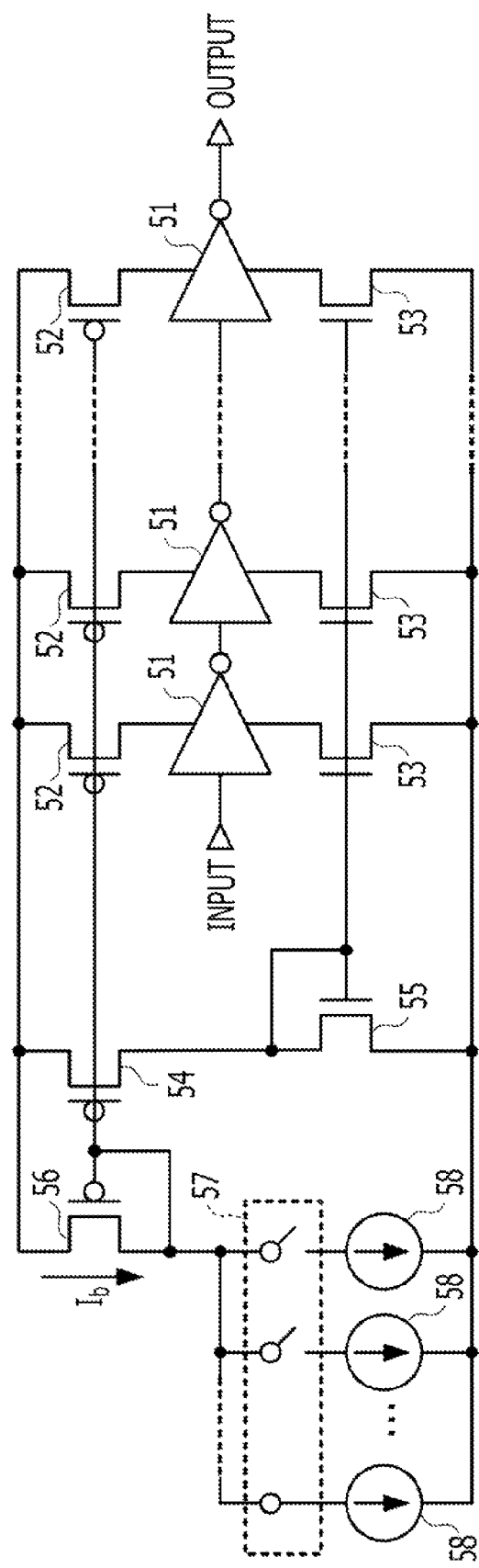
FIG. 13 illustrates an exemplary delay circuit.

FIG. 13 illustrates an exemplary delay circuit 17. The delay circuit 17 illustrated in FIG. 13 includes one or a plurality of delay elements, for example, inverters 51, and a PMOS transistor 52 and an NMOS transistor 53 that are provided corresponding to the inverter 51. A set of a PMOS transistor 52 and an NMOS transistor 53 adjusts a drive current amount that flows through the corresponding inverter 51. The delay circuit 17 further includes a PMOS transistor 54, an NMOS transistor 55, a PMOS transistor 56, a switch circuit 57, and a plurality of current sources 58. The switch circuit 57 includes a plurality of switches, and conducts one or a combination of the plurality of switches, for example, according to an adjustment code OUT that is output from the register 27 of the delay quantity adjustment circuit 19 of FIG. 6. One or the plurality of the selected current sources 58 is coupled to the PMOS transistor 56 and a current amount Ib that corresponds to a total amount of the current amounts of the selected current source 58 is applied to the PMOS transistor 56. A gate of the PMOS transistor 56 and the PMOS transistor 54 is common and includes a current mirror circuit. Thus, a current amount that is substantially equal to the current amount that flows through the PMOS transistor 56 flows through the PMOS transistor 54. The current amount substantially the same as the current amount flows through the NMOS transistor 55 that is serially coupled to the PMOS transistor 54. A gate of the PMOS transistor 52 and the PMOS transistor 54 that drive each inverter 51 is common. Further, a gate of the NMOS transistor 53 and the NMOS transistor 55 is common. Hence, a current amount Ib that is set according to the adjustment code OUT is supplied to each inverter 51 as a drive current.

Figure 14:
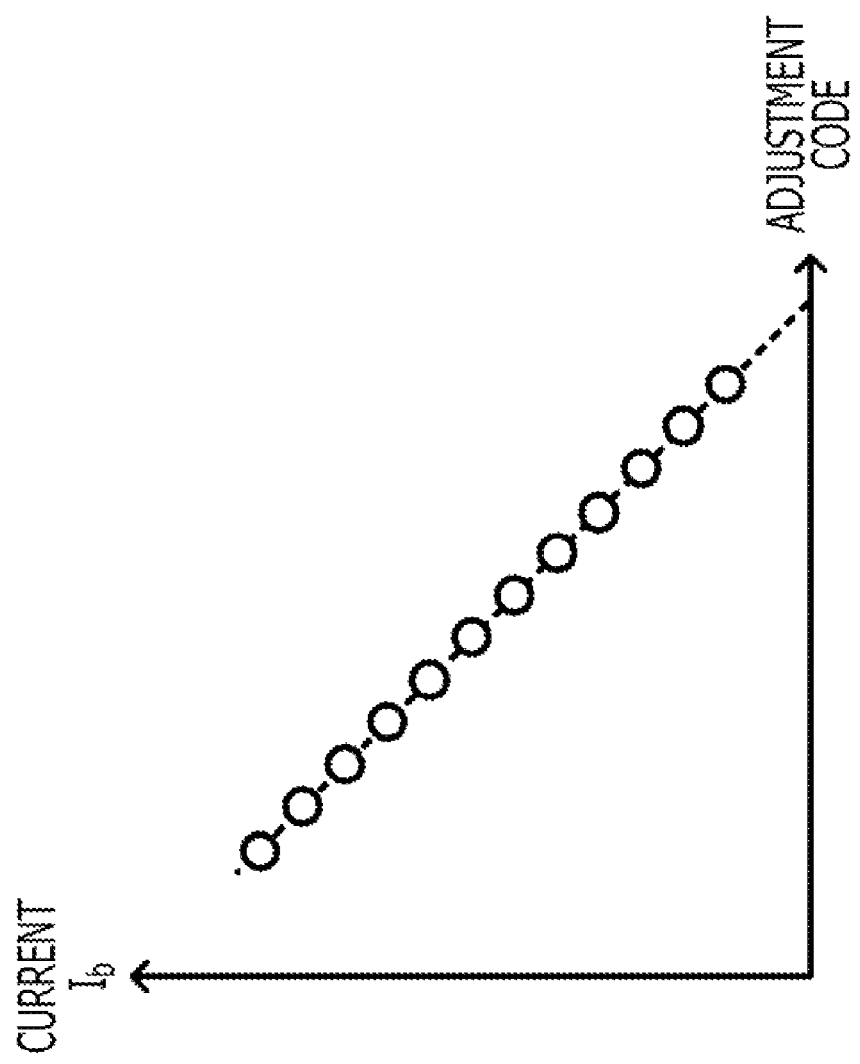
FIG. 14 illustrates an exemplary relationship between adjustment codes and current amounts.
Figure 15:
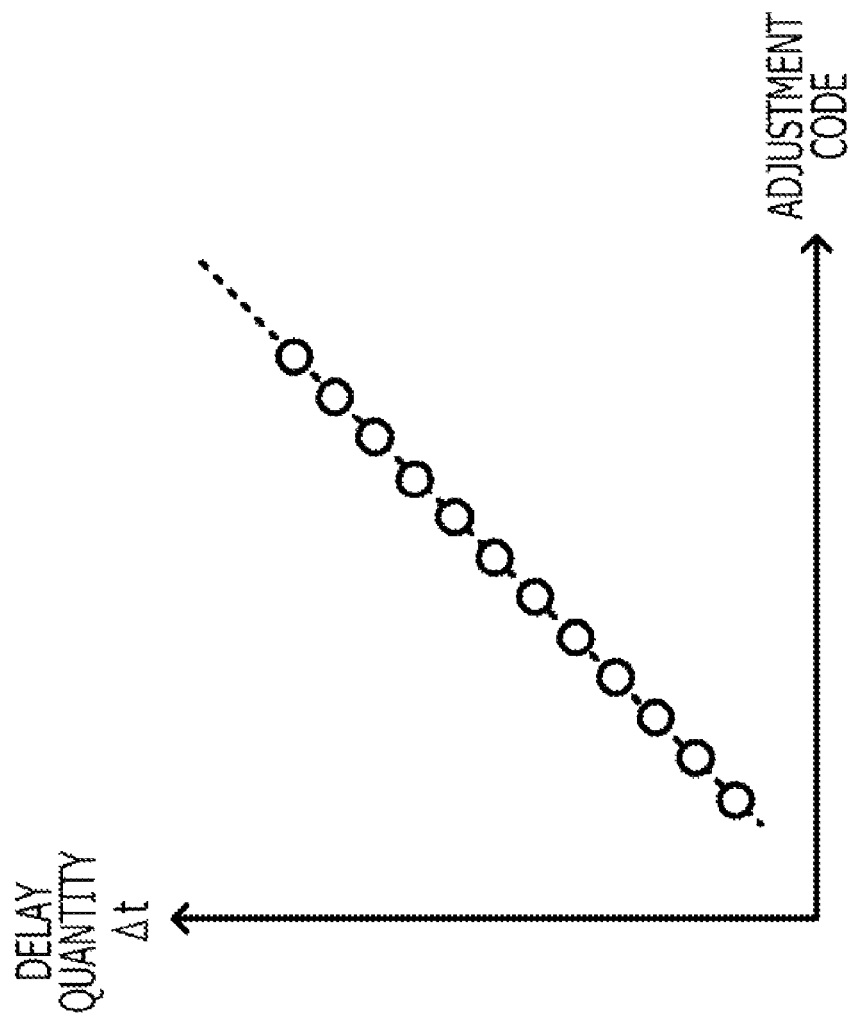
FIG. 15 illustrates an exemplary relationship between adjustment codes and delay quantities.

FIG. 14 illustrates an exemplary relationship between an adjustment code and a current amount. FIG. 15 illustrates an exemplary relationship between an adjustment code and a delay quantity. As illustrated in FIG. 14, the switch circuit 57 and the current source 58 in FIG. 13 are designed so that increasing a value of the adjustment code linearly decreases a current amount Ib. As the drive current becomes larger, the response speed of the inverter 51, for example, speed of output signal transition in response to the input signal transition becomes faster. Therefore, as illustrated in FIG. 14, when a value of adjustment code increases and the drive current decreases, a response speed of each inverter 51 may slow down, thereby the delay quantity increasing. As illustrated in FIG. 15, a delay quantity Δt may increase by increasing the value of the adjustment code.

All examples and conditional language recited herein are intended for pedagogical objects to aid the reader in understanding the invention and the concepts contributed by the inventor to furthering the art, and are to be construed as being without limitation to such specifically recited examples and conditions. Although the embodiment(s) of the present inventions have been described in detail, it should be understood that the various changes, substitutions, and alterations could be made hereto without departing from the spirit and scope of the invention.

The invention claimed is:

1. A successive approximation register analog-to-digital converter, comprising:
   a digital-to-analog converter that generates an analog voltage based on a digital code;
   a comparator that receives the analog voltage;
   a control circuit that generates a digital code of an input voltage sampled from an external clock signal by successively changing the digital code based on a comparison result of the comparator;
   a delay circuit that resets the comparator based on a signal transition generated by delaying the comparison result; and
   an adjustment circuit that counts a value indicating a number of the signal transition being generated during a cycle of the external clock signal and adjusts a delay of the delay circuit according to a counted value.

2. The successive approximation register analog-to-digital converter according to claim 1, wherein the adjustment circuit includes:
   a counter that counts the value; and
   a determination circuit that determines whether the counted value is substantially equal to a predetermined value,
   wherein the adjustment circuit adjusts the delay of the delay circuit according to a determination result of the determination circuit.

3. The successive approximation register analog-to-digital converter according to claim 1, wherein the control circuit successively changes the digital code in synchronization with the signal transition.

4. The successive approximation register analog-to-digital converter according to claim 1, further comprising:
   a gate circuit that receives the comparison result, outputs a first signal according to an assert of the comparison result and outputs a second signal according to a negate of the comparison result,
   wherein an output of the gate circuit is input to the delay circuit.

5. The successive approximation register analog-to-digital converter according to claim 1, wherein the delay circuit includes:

a plurality of serially coupled delay elements; and a selection circuit that selects at least one of the plurality of serially coupled delay elements according to an output of the adjustment circuit.

6. The successive approximation register analog-to-digital converter according to claim 1, wherein the delay circuit includes:

one or more delay elements; and another adjustment circuit that adjusts a drive current of the one or more delay element according to an output of the adjustment circuit.

7. The successive approximation register analog-to-digital converter according to claim 1, wherein the digital-to-analog converter includes a capacitive digital-to-analog converter.

8. The successive approximation register analog-to-digital converter according to claim 1, wherein the adjustment circuit increases the delay of the delay circuit when the count value is larger than a predetermined value, and decreases the delay of the delay circuit when the count value is smaller than the predetermined value.

9. A method of adjusting a delay in a successive approximation register analog-to-digital converter comprising:

generating analog voltages based on a digital code;

comparing the analog voltages to each other using a comparator to output a comparison result;

generating a digital code of an input voltage sampled from an external clock signal by successively changing the digital code based on the comparison result;

generating a signal transition by delaying the comparison result for a certain amount;

resetting the comparator by the signal transition;

counting a value indicating a number of the signal transition being generated during a cycle of the external clock signal; and adjusting the amount according to the count value of the signal transition.

10. The method according to claim 9, further comprising:

increasing the amount when the count value is larger than a predetermined value; and decreasing the amount when the count value is smaller than the predetermined value.

11. The method according to claim 9, wherein:

the digital code is successively changed in synchronization with the signal transition.

\* \* \* \* \*